(12) United States Patent
Liao et al.

(10) Patent No.: US 10,959,340 B2
(45) Date of Patent: Mar. 23, 2021

(54) WATERPROOF MODULE AND DISPLAY DEVICE

(71) Applicant: Wistron Corporation, New Taipei (TW)

(72) Inventors: Ping-Feng Liao, New Taipei (TW); Po-Yuan Hsu, New Taipei (TW); Tsung-Hsien Chen, New Taipei (TW); Chia-Cheng Su, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/207,172

(22) Filed: Dec. 2, 2018

(65) Prior Publication Data
US 2020/0107457 A1 Apr. 2, 2020

(30) Foreign Application Priority Data
Sep. 28, 2018 (TW) .................................. 107134252

(51) Int. Cl.
*H05K 5/00* (2006.01)
*H05K 5/03* (2006.01)
*H05K 5/02* (2006.01)

(52) U.S. Cl.
CPC ......... *H05K 5/0017* (2013.01); *H05K 5/0008* (2013.01); *H05K 5/0217* (2013.01); *H05K 5/03* (2013.01)

(58) Field of Classification Search
CPC .. H05K 5/0017; H05K 5/0008; H05K 5/0217; H05K 5/03; G06F 1/163
See application file for complete search history.

(56) References Cited

U.S. PATENT DOCUMENTS

| 10,599,327 B2* | 3/2020 | Kim | G06F 3/0482 |
| 2011/0192625 A1* | 8/2011 | Hsu | G06F 1/1656 |
| | | | 174/50 |
| 2013/0146323 A1* | 6/2013 | Yamaguchi | H01M 2/1066 |
| | | | 174/50 |
| 2013/0292383 A1* | 11/2013 | Mullaney | H05K 5/062 |
| | | | 220/378 |
| 2014/0113467 A1* | 4/2014 | Senatori | H01R 13/447 |
| | | | 439/142 |

(Continued)

FOREIGN PATENT DOCUMENTS

| CN | 104053328 A | 9/2014 |
| TW | 201124815 A1 | 7/2011 |

*Primary Examiner* — Rockshana D Chowdhury
*Assistant Examiner* — Douglas R Burtner
(74) *Attorney, Agent, or Firm* — Winston Hsu (57) ABSTRACT

A waterproof module includes a frame, a sliding member, a ring-shaped sealing member, a cover and an adjusting member. The frame has an accommodating recess. The sliding member is disposed in the accommodating recess and has a tapered structure. An end of the tapered structure is between the frame and the ring-shaped sealing member. The cover is disposed on the frame. The adjusting member is connected to the sliding member. When the adjusting member drives the sliding member to move within the accommodating recess towards a first direction, the tapered structure pushes the ring-shaped sealing member to move towards a second direction, wherein the first direction is different from the second direction.

16 Claims, 13 Drawing Sheets

(56) References Cited

U.S. PATENT DOCUMENTS

| | | | |
|---|---|---|---|
| 2014/0262847 A1* | 9/2014 | Yang | F16M 11/14 |
| | | | 206/37 |
| 2016/0050776 A1* | 2/2016 | Drysdale | G06F 1/1656 |
| | | | 361/679.01 |
| 2016/0309604 A1* | 10/2016 | Steijner | E06B 7/22 |
| 2017/0347478 A1* | 11/2017 | Park | H05K 7/1461 |
| 2018/0206354 A1* | 7/2018 | Yoon | G06F 1/1688 |

\* cited by examiner

WATERPROOF MODULE AND DISPLAY DEVICE

BACKGROUND OF THE DISCLOSURE

1. Field of the Disclosure

The disclosure relates to a waterproof module and a display device and, more particularly, to a waterproof module capable of achieving waterproof function effectively and a display device equipped with the waterproof module.

2. Description of the Prior Art

To satisfy a user with the requirements of image quality and appearance, there is a tendency towards a narrow frame for designing a display device. However, the narrow frame is harmful to waterproof function. At present, the prior art disposes a waterproof region around a periphery of the frame of the display device. When the display device is embedded in a wall, the waterproof region is parallel to a surface of the wall. Therefore, the wider the waterproof region is, the better the waterproof effect is. However, the wider the waterproof region is, the wider the black matrix (BM) of the display device is, such that the appearance of the display device will be affected. If the width of the black matrix of the display device is reduced, the width of the waterproof region has to be reduced correspondingly. Consequently, the waterproof function will get worse.

SUMMARY OF THE DISCLOSURE

The disclosure provides a waterproof module capable of achieving waterproof function effectively and a display device equipped with the waterproof module, so as to solve the aforesaid problems.

According to an embodiment of the disclosure, a waterproof module comprises a frame, a sliding member, a ring-shaped sealing member, a cover and an adjusting member. The frame has an accommodating recess. The sliding member is disposed in the accommodating recess and has a tapered structure. An end of the tapered structure is between the frame and the ring-shaped sealing member. The cover is disposed on the frame. The adjusting member is connected to the sliding member. When the adjusting member drives the sliding member to move within the accommodating recess towards a first direction, the tapered structure pushes the ring-shaped sealing member to move towards a second direction, wherein the first direction is different from the second direction.

According to another embodiment of the disclosure, a display device comprises a display panel and a waterproof module. The waterproof module comprises a frame, a sliding member, a ring-shaped sealing member, a cover and an adjusting member. The display panel is disposed in the frame. The frame has an accommodating recess. The sliding member is disposed in the accommodating recess and has a tapered structure. An end of the tapered structure is between the frame and the ring-shaped sealing member. The cover is disposed on the frame. The adjusting member is connected to the sliding member. When the adjusting member drives the sliding member to move within the accommodating recess towards a first direction, the tapered structure pushes the ring-shaped sealing member to move towards a second direction, wherein the first direction is different from the second direction.

As mentioned in the above, a user may embed the waterproof module of the disclosure in an object (e.g. wall, casing, etc.) and then operate the adjusting member to drive the sliding member to move. At this time, the tapered structure of the sliding member pushes the ring-shaped sealing member to move towards an inner wall of the object, such that the ring-shaped sealing member abuts against the inner wall of the object tightly. Accordingly, the ring-shaped sealing member can insulate a liquid permeating into the inner wall of the object effectively, so as to achieve waterproof function. Furthermore, the disclosure may dispose the display panel in the frame of the waterproof module to form the display device. Since the waterproof module of the disclosure is irrelevant to the waterproof region of the display device of the prior art, the width of the black matrix of the display device can be reduced according to practical applications. Accordingly, a narrow frame can be applied to the display device of the disclosure well.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
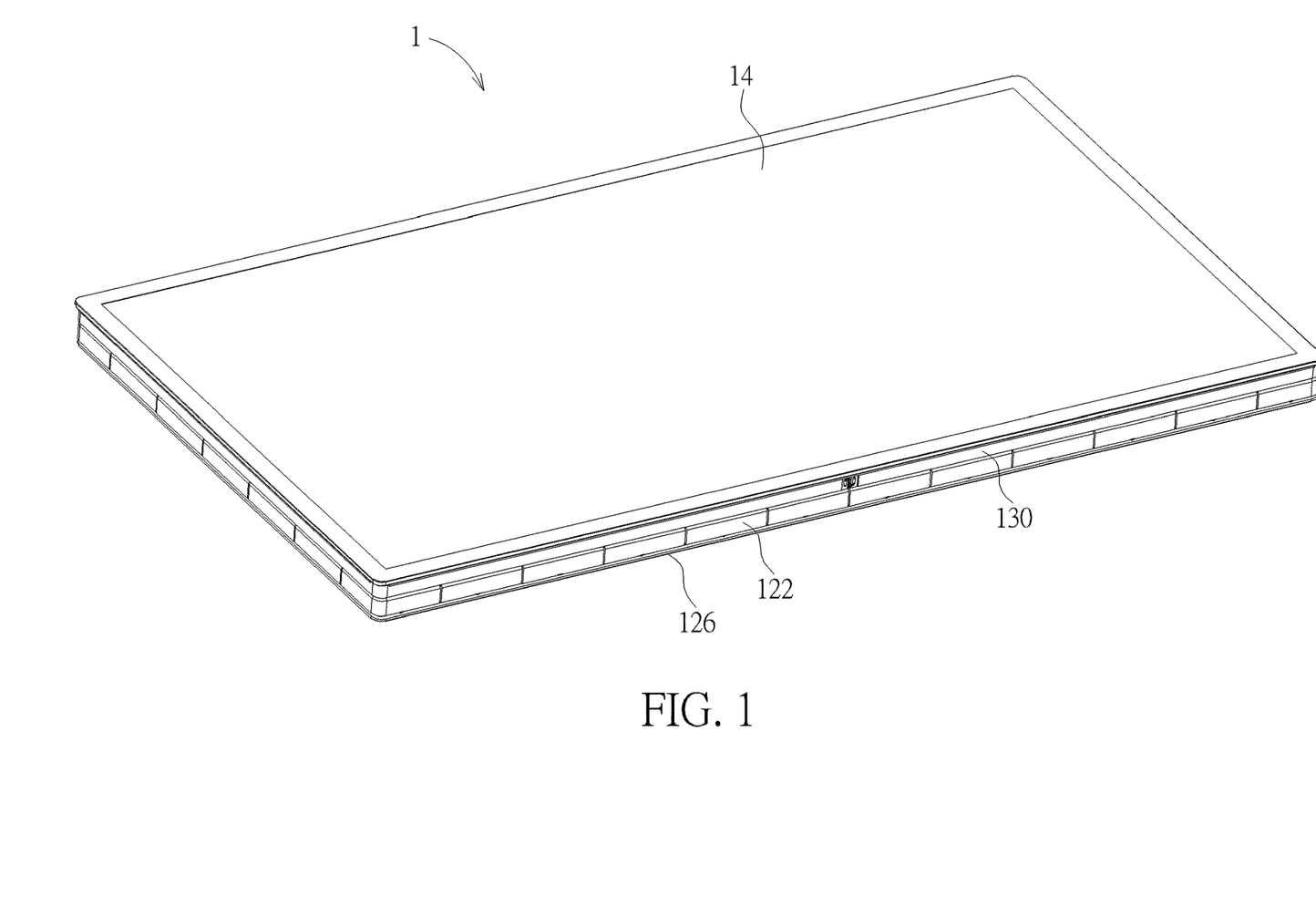
FIG. 1 is a perspective view illustrating a display device according to an embodiment of the disclosure.
Figure 2:
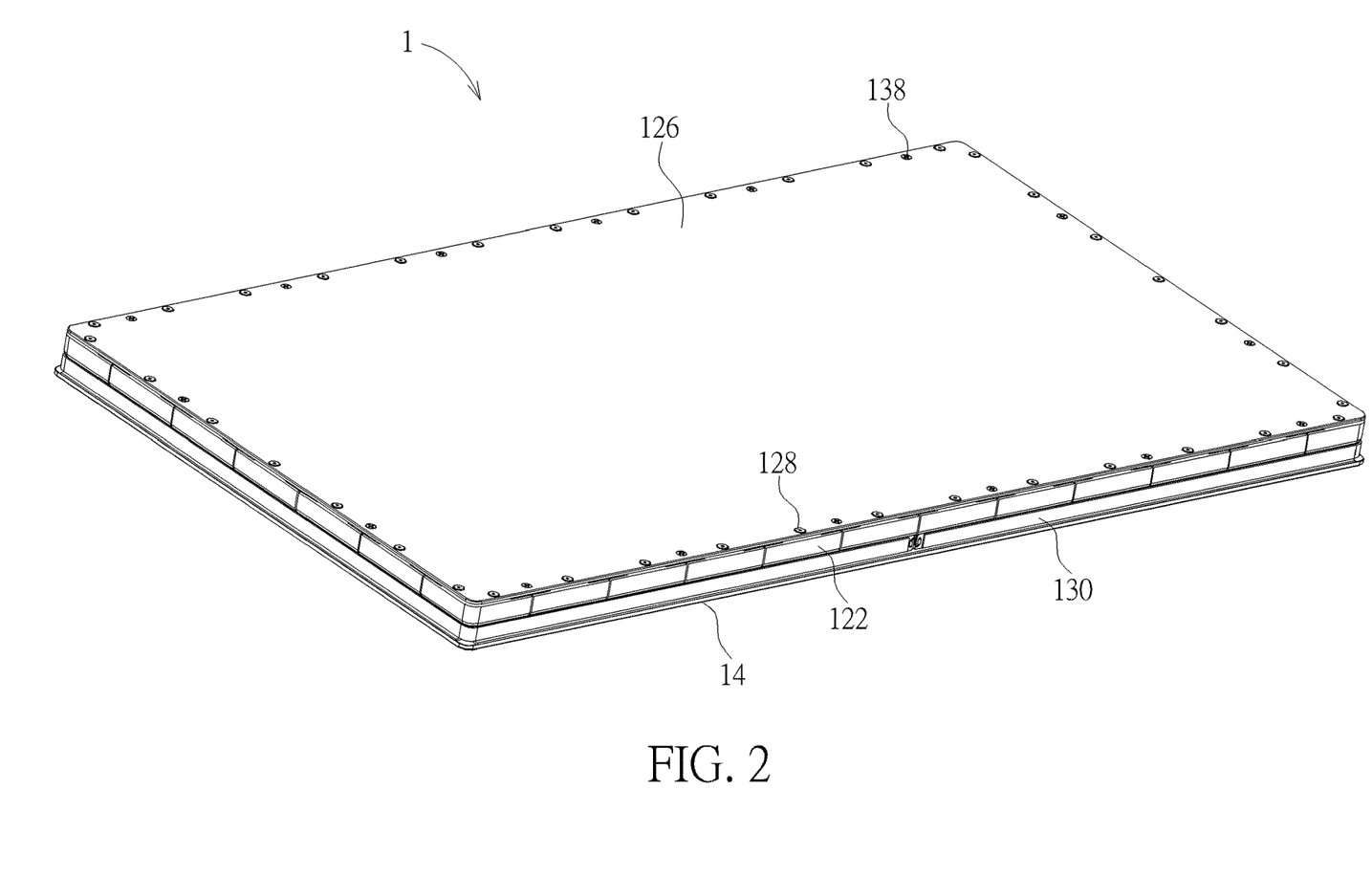
FIG. 2 is a perspective view illustrating the display device shown in FIG. 1 from another viewing angle.
Figure 3:
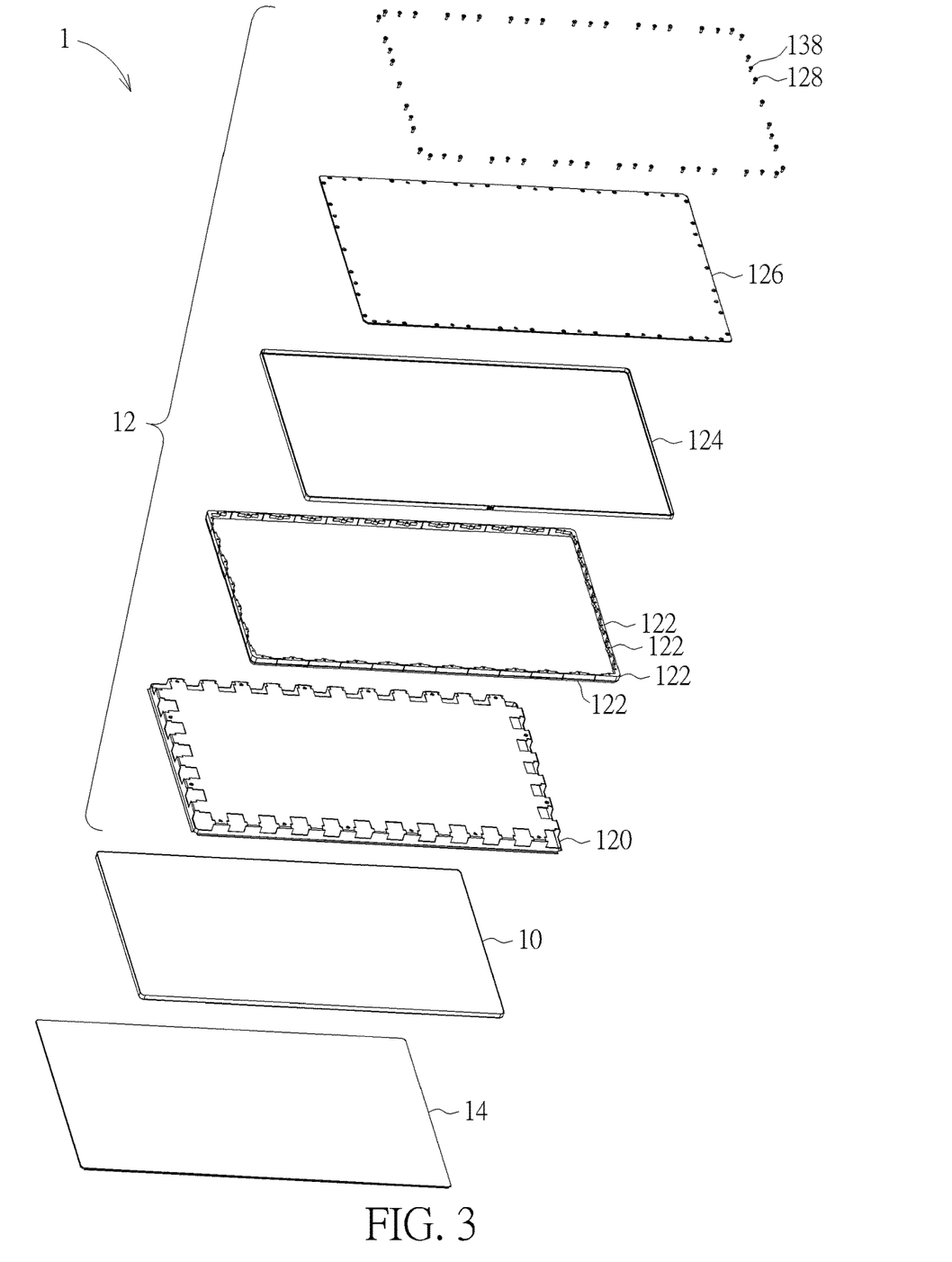
FIG. 3 is an exploded view illustrating the display device shown in FIG. 2.
Figure 4:
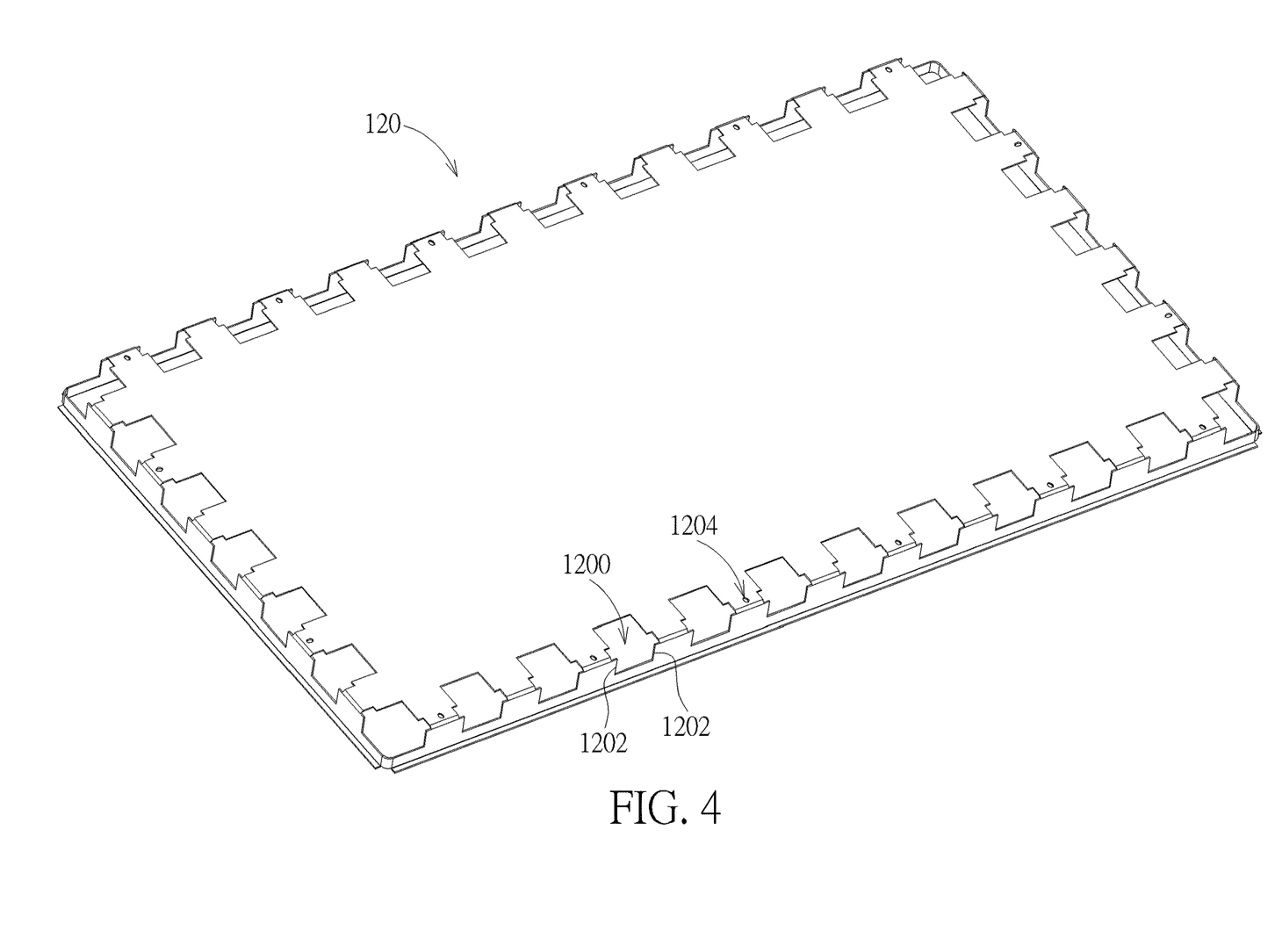
FIG. 4 is a perspective view illustrating the frame shown in FIG. 3.
Figure 5:
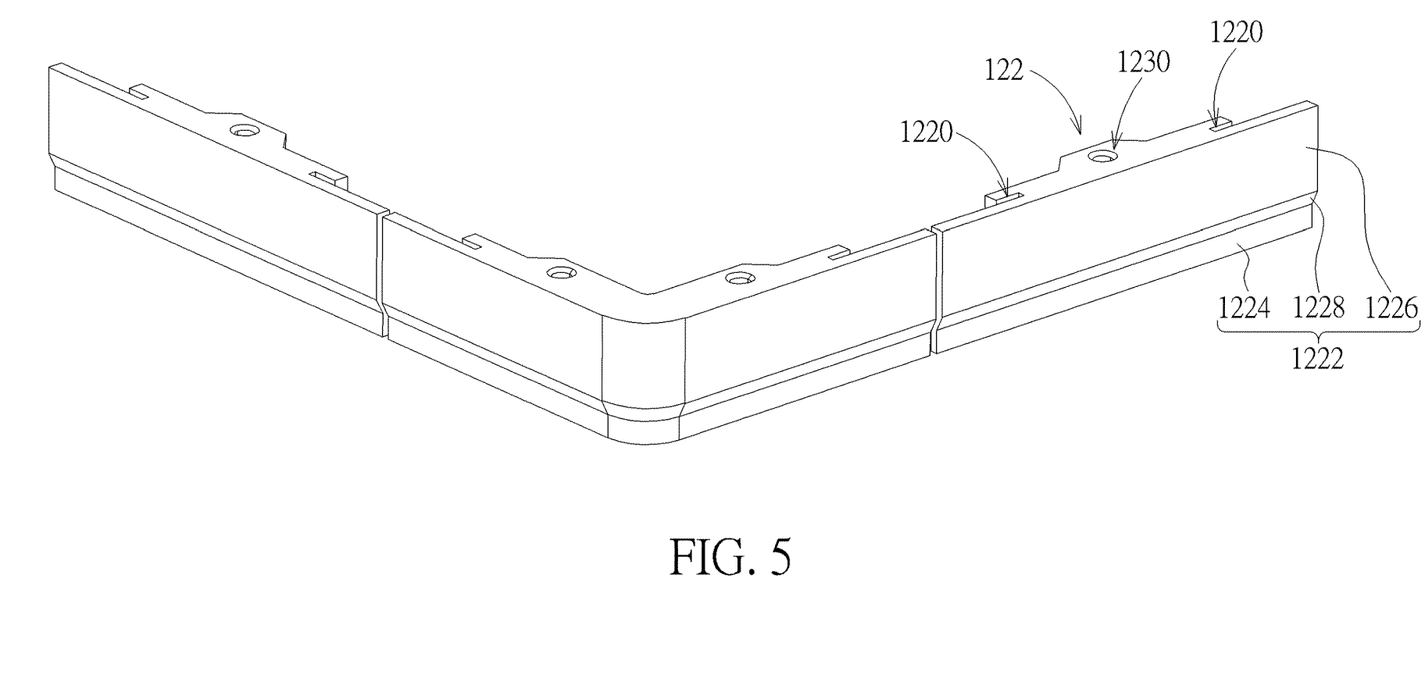
FIG. 5 is a perspective view illustrating parts of the sliding members shown in FIG. 3.
Figure 6:
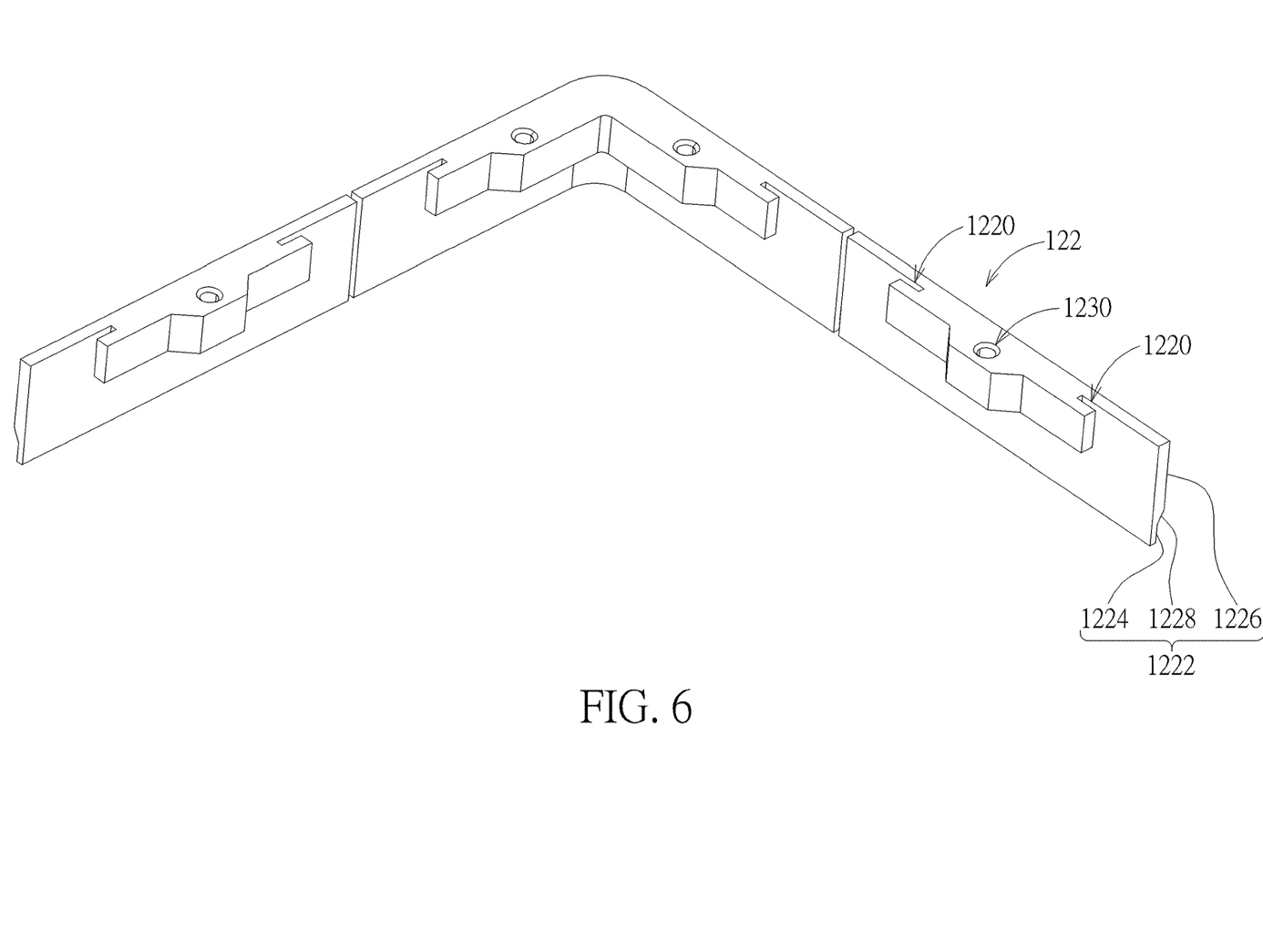
FIG. 6 is a perspective view illustrating the sliding members shown in FIG. 5 from another viewing angle.
Figure 7:
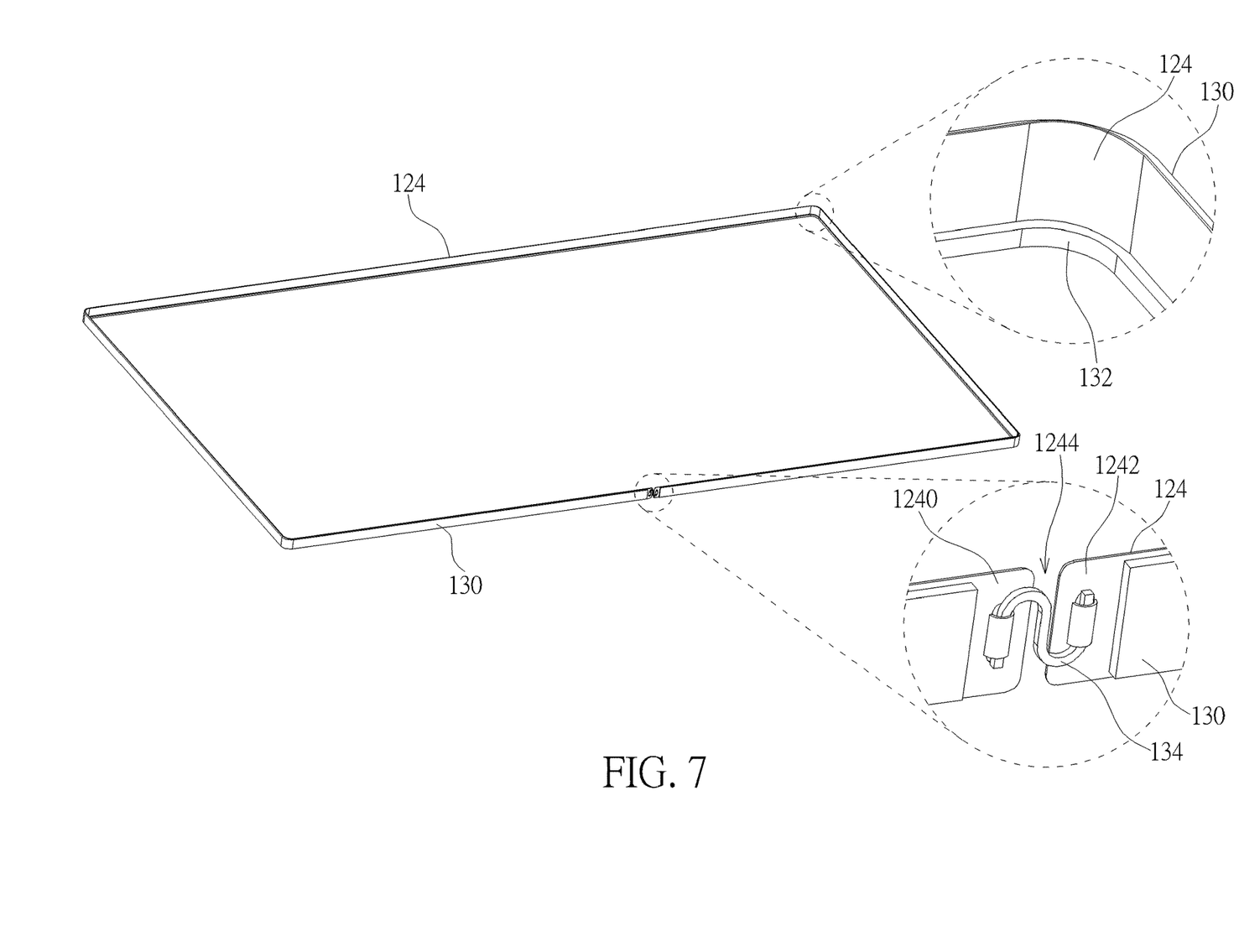
FIG. 7 is a perspective view illustrating the ring-shaped sealing member shown in FIG. 3.
Figure 8:
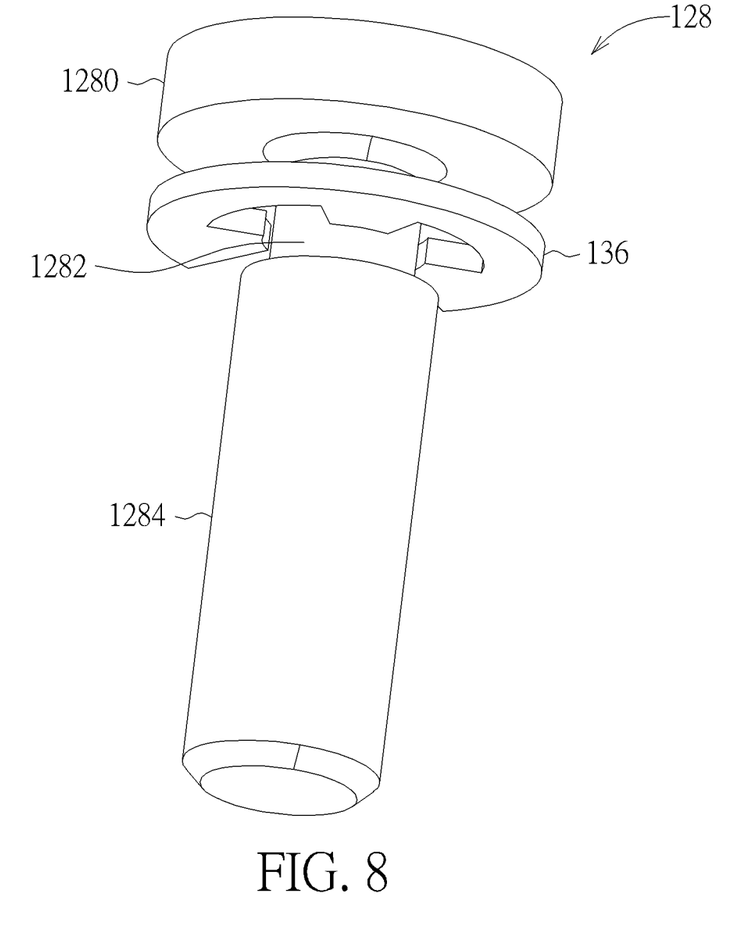
FIG. 8 is a perspective view illustrating one of the adjusting members shown in FIG. 3 and the retainer.

Referring to FIGS. 1 to 8, FIG. 1 is a perspective view illustrating a display device 1 according to an embodiment of the disclosure, FIG. 2 is a perspective view illustrating the display device 1 shown in FIG. 1 from another viewing angle, FIG. 3 is an exploded view illustrating the display device 1 shown in FIG. 2, FIG. 4 is a perspective view illustrating the frame 120 shown in FIG. 3, FIG. 5 is a perspective view illustrating parts of the sliding members 122 shown in FIG. 3, FIG. 6 is a perspective view illustrating the sliding members 122 shown in FIG. 5 from another viewing angle, FIG. 7 is a perspective view illustrating the ring-shaped sealing member 124 shown in FIG. 3, and FIG. 8 is a perspective view illustrating one of the adjusting members 128 shown in FIG. 3 and the retainer 136.

Figure 9:
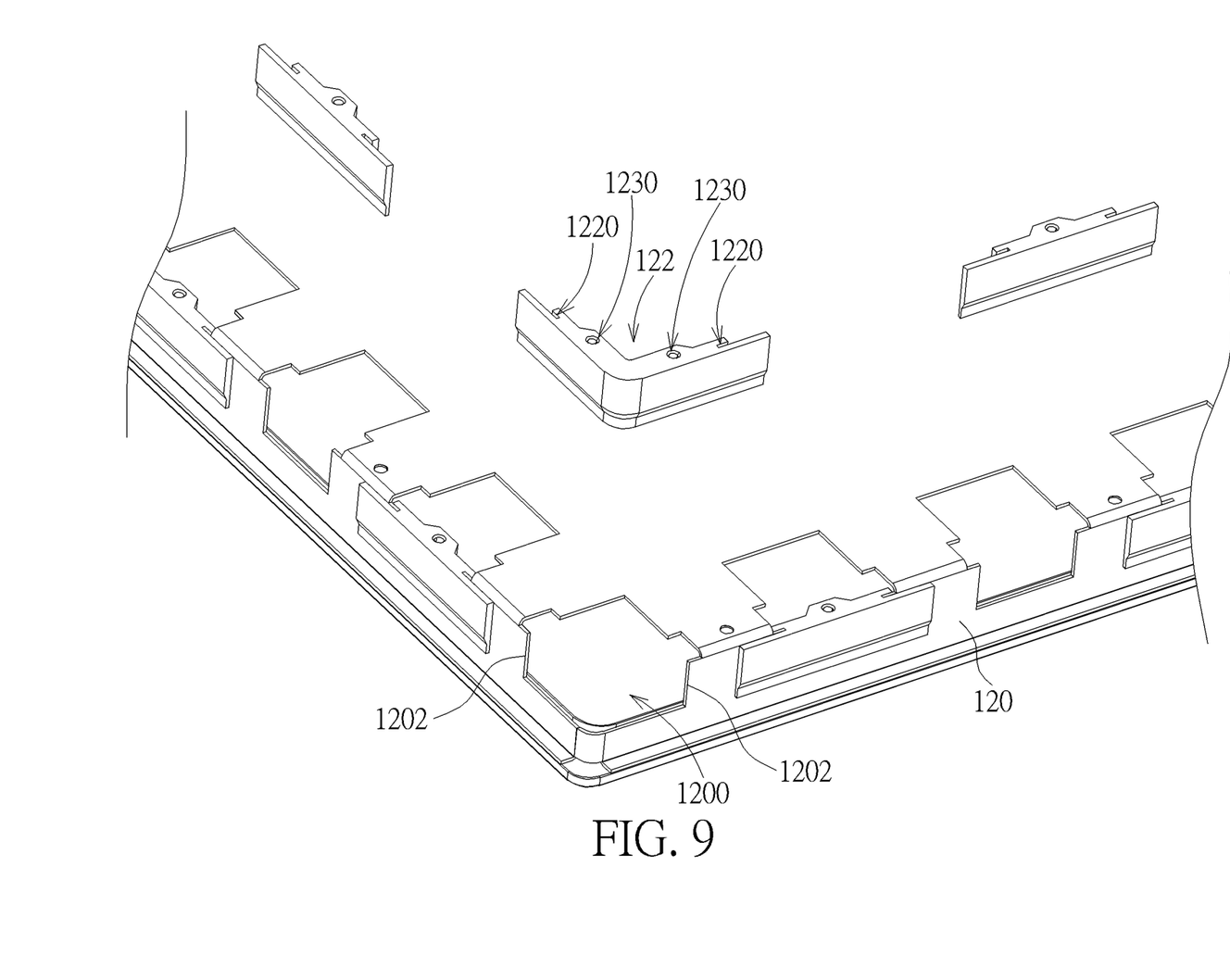
FIG. 9 is a partial perspective view illustrating the sliding member being assembled to the frame.

As shown in FIGS. 1 to 8, the display device 1 comprises a display panel 10, a waterproof module 12 and a touch panel 14. The waterproof module 12 comprises a frame 120, a sliding member 122, a ring-shaped sealing member 124, a cover 126, an adjusting member 128, a first gasket 130, a second gasket 132, an elastic member 134 and a retainer 136. In this embodiment, the waterproof module 12 may comprise a plurality of sliding members 122, a plurality of adjusting members 128 and a plurality of retainers 136. It should be noted that the number of the sliding members 122, the adjusting members 128 and the retainers 136 may be determined according to practical applications, so the disclosure is not limited to the embodiment shown in the figures. Furthermore, the sliding member 122 may be L-shaped or I-shaped. As shown in FIG. 9, the sliding member 122 corresponding to a corner of the frame 120 may be L-shaped and the sliding member 122 corresponding to an edge of the frame 120 may be I-shaped. Still further, the waterproof module 12 further comprises a plurality of fixing members 128 (e.g. screws) for fixing the cover 126 on the frame 120.

Figure 12:
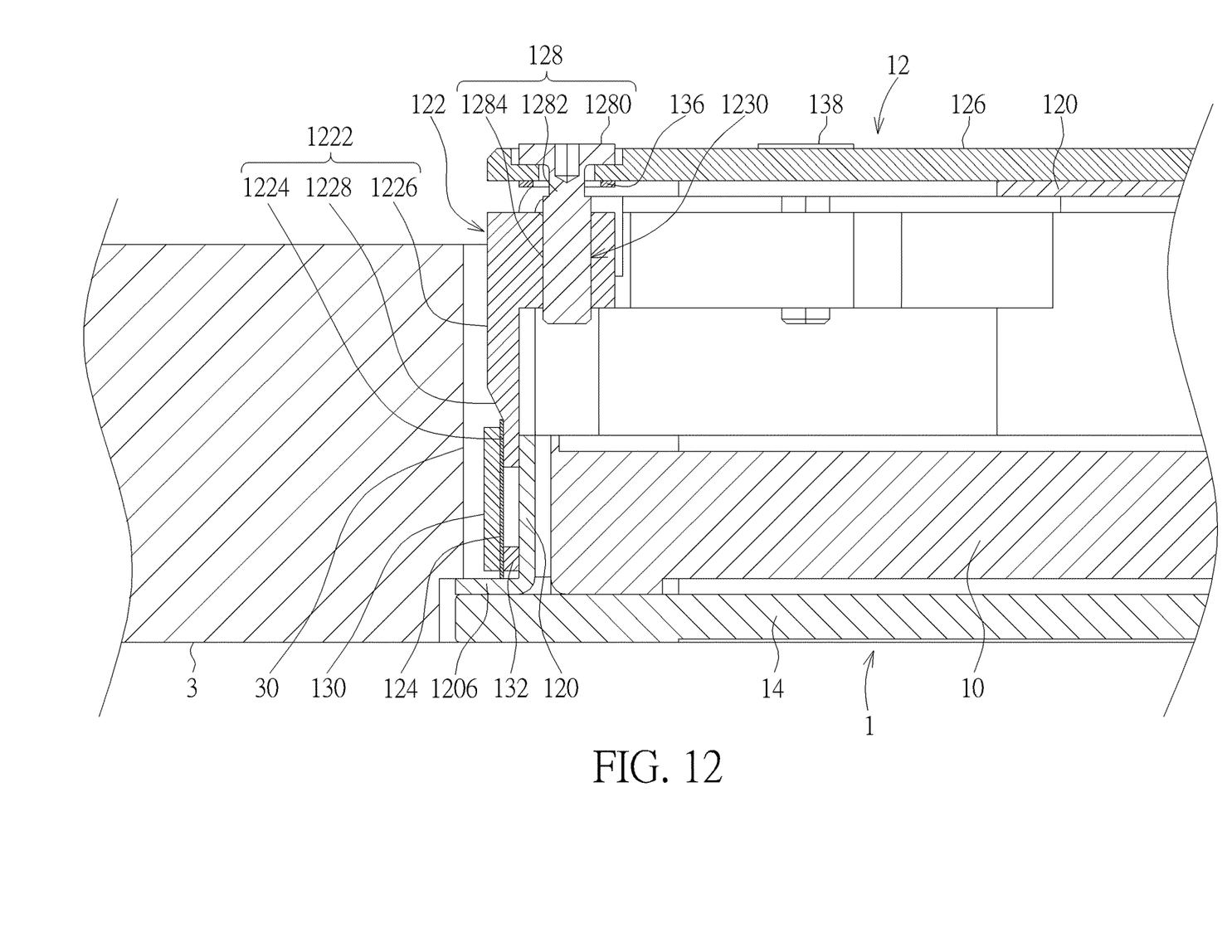
FIG. 12 is a partial sectional view illustrating the display device and the object along line X-X shown in FIG. 11.
Figure 13:
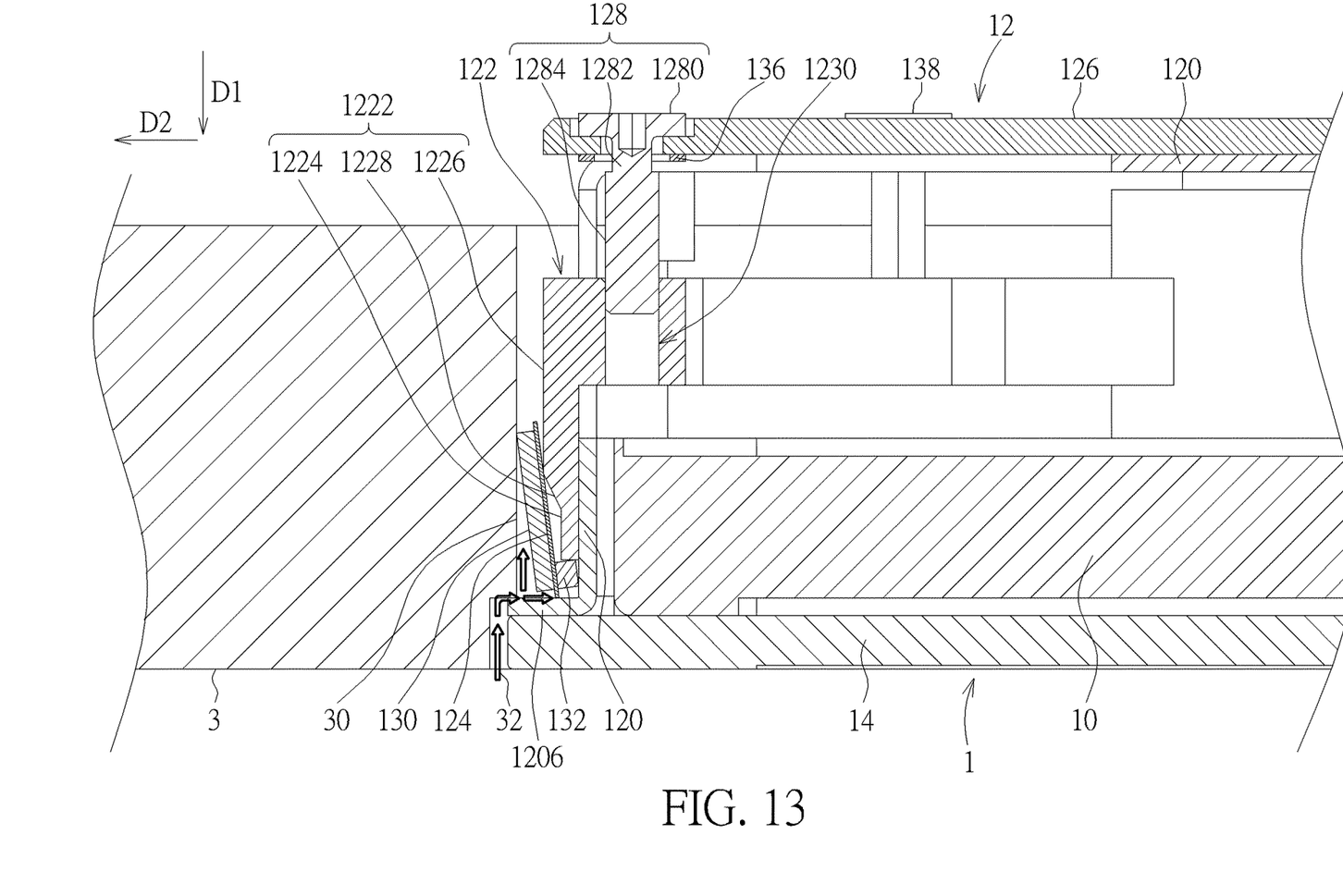
FIG. 13 is a sectional view illustrating the sliding member shown in FIG. 12 after movement.

The display panel 10 is disposed in the frame 120. The touch panel 14 is disposed on the display panel 10 and fixed on a flange 1206 of the frame 120 (as shown in FIGS. 12 and 13). It should be noted that the touch panel 14 may be replaced by a protective glass according to practical applications.

As shown in FIG. 4, the frame 120 has an accommodating recess 1200 and each of opposite sides of the accommodating recess 1200 has a guiding rail 1202. In this embodiment, the number of the accommodating recesses 1200 corresponds to the number of the sliding members 122. As shown in FIGS. 5 and 6, each of opposite sides of the sliding member 122 has a guiding groove 1220. When assembling the frame 120 and the sliding member 122, the guiding rails 1202 of the accommodating recess 1200 are disposed in the guiding grooves 1220 of the sliding member 122, such that the sliding member 122 is disposed in the accommodating recess 1200. Furthermore, the sliding member 122 has a tapered structure 1222. In this embodiment, the tapered structure 1222 has a first flat surface 1224, a second flat surface 1226 and an inclined surface 1228, wherein the inclined surface 1228 connects the first flat surface 1224 and the second flat surface 1226, such that a step difference exists between the first flat surface 1224 and the second flat surface 1226. In another embodiment, the tapered structure 1222 may be a tapered inclined surface, so the disclosure is not limited to the embodiment shown in the figures.

The ring-shaped sealing member 124 surrounds the periphery of the frame 120 and an end of the tapered structure 1222 of the sliding member 122 (i.e. the first flat surface 1224) is between the frame 120 and the ring-shaped sealing member 124. As shown in FIG. 7, an opening 1244 exists between a first end 1240 and a second end 1242 of the ring-shaped sealing member 124. The elastic member 134 is configured to connect the first end 1240 and the second end 1242 of the ring-shaped sealing member 124, so as to force the ring-shaped sealing member 124 to abut against the sliding members 122 tightly. Furthermore, the first gasket 130 and the second gasket 132 are disposed at opposite sides of the ring-shaped sealing member 124, wherein an area of the first gasket 130 is larger than an area of the second gasket 132 and the second gasket 132 is disposed at an end of the ring-shaped sealing member 124. In this embodiment, the first gasket 130 may cover an outer surface of the ring-shaped sealing member 124 substantially and the second gasket 132 may be disposed at a lower end of an inner surface of the ring-shaped sealing member 124, but is not so limited. In this embodiment, the material of the ring-shaped sealing member 124 may be stainless steel, rubber, composite material, or other elastic materials, and the material of the first gasket 130 and the second gasket 132 may be rubber, sponge, or other elastic materials. Moreover, the elastic member 134 may be, but not limited to, an S-shaped elastic plate. It should be noted that the ring-shaped sealing member 124 may be formed as a closed ring without the opening 1244, such that the elastic member 134 may be omitted.

The adjusting member 128 is disposed on the cover 126 and connected to the sliding member 122. As shown in FIG. 8, the adjusting member 128 has a head portion 1280, a neck portion 1282 and a threaded portion 1284, wherein the neck portion 1282 is located between the head portion 1280 and the threaded portion 1284. Furthermore, as shown in FIGS. 5 and 6, the sliding member 122 has a threaded hole 1230. After assembling the adjusting member 128, the retainer 136 and the cover 126, the retainer 136 engages with the neck portion 1282 of the adjusting member 128, and the head portion 1280 of the adjusting member 128 and the retainer 136 are located at opposite sides of the cover 126, such that the adjusting member 128 is rotatably disposed on the cover 126. Still further, the threaded portion 1284 of the adjusting member 128 is disposed in the threaded hole 1230 of the sliding member 122, such that the adjusting member 128 is connected to the sliding member 122. When the adjusting member 128 rotates with respect to the cover 126, the adjusting member 128 only rotates without moving since the retainer 136 retains the adjusting member 128. At this time, the sliding member 122 moves along the threaded portion 128 of the adjusting member 128 through the threaded hole 1230. In this embodiment, the retainer 136 may be, but not limited to, an E-shaped retainer.

Figure 10:
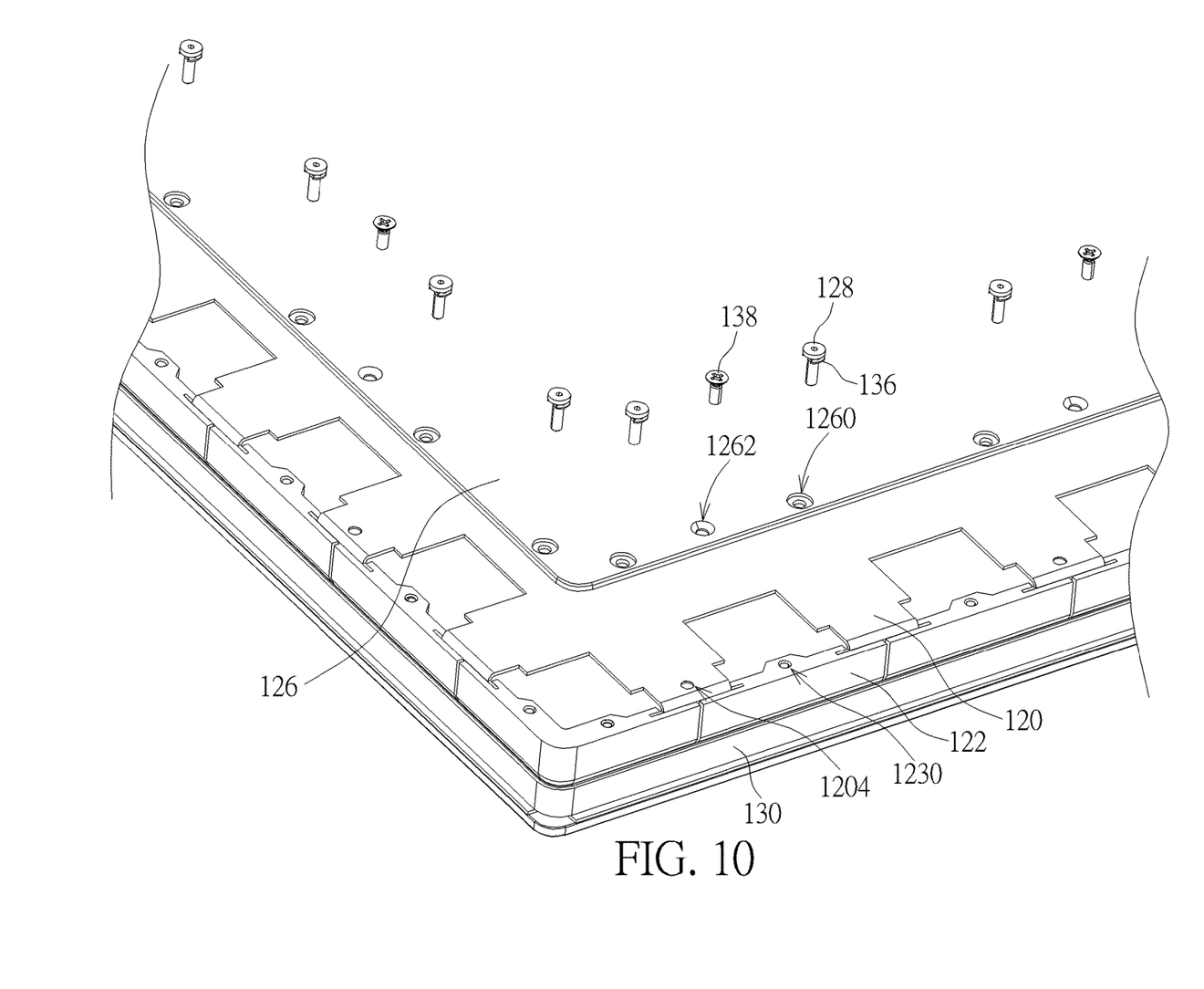
FIG. 10 is a partial perspective view illustrating the adjusting member and the cover being assembled to the frame.

Referring to FIGS. 9 and 10, FIG. 9 is a partial perspective view illustrating the sliding member 122 being assembled to the frame 120 and FIG. 10 is a partial perspective view illustrating the adjusting member 128 and the cover 126 being assembled to the frame 120.

As shown in FIG. 9, when assembling the sliding member 122 to the frame 120, an operator inserts the guiding rails 1202 on opposite sides of the accommodating recess 122 into the guiding grooves 1220 on opposite sides of the sliding member 122, such that the sliding member 122 is disposed in the accommodating recess 1200. After disposing each of the sliding members 122 in the accommodating recess 1200 correspondingly, the operator disposes the ring-shaped sealing member 124 around the periphery of the frame 120, such that an end of the tapered structure 1222 of the sliding member 122 (i.e. the first flat surface 1224) is between the frame 120 and the ring-shaped sealing member 124, as shown in FIG. 10. Then, the operator uses the elastic member 134 to connect the first end 1240 and the second end 1242 of the ring-shaped sealing member 124 (as shown in FIG. 7), so as to force the ring-shaped sealing member 124 to abut against the sliding members 122 tightly. Then, the operator inserts the threaded portion 1284 of the adjusting member 128 into a through hole 1260 of the cover 126 and then uses the retainer 136 to engage the neck 1282 of the adjusting member 128, such that the head portion 1280 of the adjusting member 128 and the retainer 136 are located at opposite sides of the cover 126. Then, the operator disposes the cover 126 on the frame 120 and screws the threaded portion 1284 of the adjusting member 128 into the threaded hole 1230 of the sliding member 122. Then, the operator inserts the fixing member 138 into a through hole 1262 of the cover 126 and fixes the fixing member 138 in a fixing hole 1204 of the frame 120. Accordingly, the waterproof module 12 is assembled completely.

Figure 11:
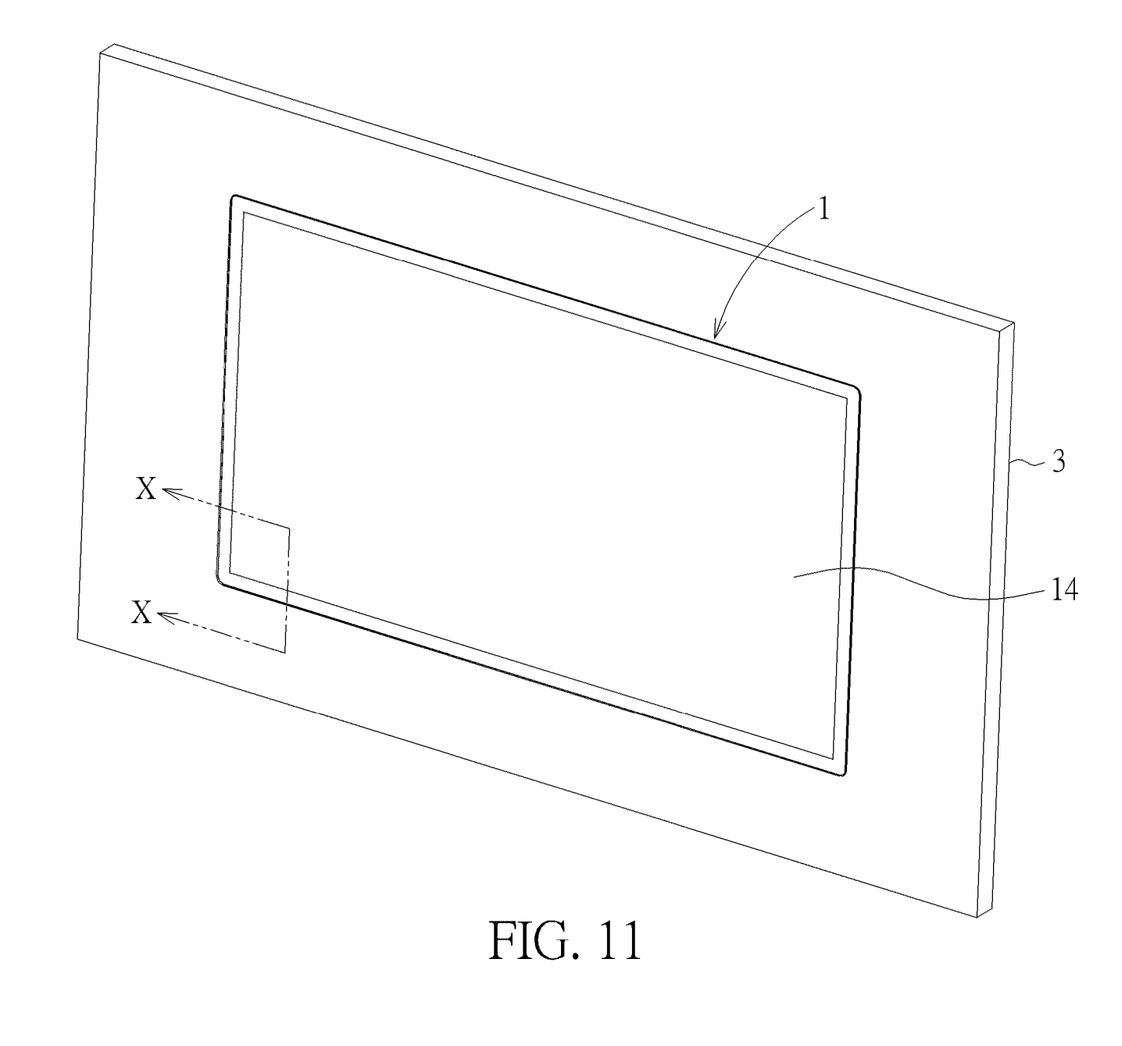
FIG. 11 is a schematic view illustrating the display device being embedded in an object.

Referring to FIGS. 11 to 13, FIG. 11 is a schematic view illustrating the display device 1 being embedded in an object 3, FIG. 12 is a partial sectional view illustrating the display device 1 and the object 3 along line X-X shown in FIG. 11, and FIG. 13 is a sectional view illustrating the sliding member 122 shown in FIG. 12 after movement.

As shown in FIGS. 11 and 12, the display device 1 may be embedded in an object 3. In this embodiment, the object 3 may be a wall, a casing or other objects capable of being equipped with the display device 1. A user can operate the adjusting member 128 from the back of the object 3 to drive the sliding member 122 to move towards a first direction D1. When the adjusting member 128 drives the sliding member 122 to move within the accommodating recess 1200 of the frame 120 towards the first direction D1, the inclined surface 1228 and the second flat surface 1226 of the tapered structure 1222 of the sliding member 122 push the ring-shaped sealing member 124 to move towards a second direction D2 (i.e. move towards an inner wall 30 of the object 3), such that the ring-shaped sealing member 124 and the first gasket 130 abuts against the inner wall 30 of the object 3 tightly, as shown in FIG. 13. The first direction D1 is different from the second direction D2. For example, the first direction D1 may be perpendicular to the second direction D2. It should be noted that the first direction D1 may be not perpendicular to the second direction D2 according to practical applications. Furthermore, when the sliding member 122 moves to the bottom of the ring-shaped sealing member 124, the sliding member 122 also abuts against the second gasket 132 tightly. Accordingly, the ring-shaped sealing member 124, the first gasket 130 and the second gasket 132 can insulate a liquid 32 (e.g. water) permeating into the inner wall of the object effectively, so as to achieve waterproof function.

When embedding the display device 1 in the object 3, the opening 1244 of the ring-shaped sealing member 124 (as shown in FIG. 7) may be oriented to a ground side of the display device 1. Since the liquid 32 always flows downward, the opening 1244 of the ring-shaped sealing member 124 will not affect the waterproof function.

It should be noted that the aforesaid display device 1 including the waterproof module 12 is just an embodiment used for illustrating technical features of the disclosure. In practical applications, the waterproof module 12 may also be disposed in a box, a door panel or other objects, so the waterproof module 12 is not limited to be disposed in the display device.

As mentioned in the above, a user may embed the waterproof module of the disclosure in an object (e.g. wall, casing, etc.) and then operate the adjusting member to drive the sliding member to move. At this time, the tapered structure of the sliding member pushes the ring-shaped sealing member to move towards an inner wall of the object, such that the ring-shaped sealing member abuts against the inner wall of the object tightly. Accordingly, the ring-shaped sealing member can insulate a liquid permeating into the inner wall of the object effectively, so as to achieve waterproof function. Furthermore, the disclosure may dispose the display panel in the frame of the waterproof module to form the display device. Since the waterproof module of the disclosure is irrelevant to the waterproof region of the display device of the prior art, the width of the black matrix of the display device can be reduced according to practical applications. Accordingly, a narrow frame can be applied to the display device of the disclosure well.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A waterproof module comprising:
    a frame having an accommodating recess, the accommodating recess having a guiding rail;
    a sliding member disposed in the accommodating recess, the sliding member having a tapered structure and a guiding groove, the guiding rail being disposed in the guiding groove, such that the sliding member is disposed in the accommodating recess, the tapered structure having a first flat surface, a second flat surface, and an inclined surface connecting the first flat surface and the second flat surface;
    a ring-shaped sealing member, an end of the tapered structure being sandwiched in between the frame and the ring-shaped sealing member;
    a cover disposed on the frame; and
    an adjusting member connected to the sliding member;
    wherein when the adjusting member drives the sliding member to move within the accommodating recess towards a first direction, the tapered structure pushes the ring-shaped sealing member to move towards a second direction, the first direction is different from the second direction.

2. The waterproof module of claim 1, further comprising a first gasket and a second gasket disposed at opposite sides of the ring-shaped sealing member.

3. The waterproof module of claim 2, wherein an area of the first gasket is larger than an area of the second gasket and the second gasket is disposed at an end of the ring-shaped sealing member.

4. The waterproof module of claim 1, wherein an opening exists between a first end and a second end of the ring-shaped sealing member, the waterproof module further comprises an elastic member, and the elastic member connects the first end and the second end.

5. The waterproof module of claim 1, wherein the adjusting member has a threaded portion, the sliding member has a threaded hole, and the threaded portion is disposed in the threaded hole, such that the adjusting member is connected to the sliding member.

6. The waterproof module of claim 5, wherein the adjusting member further has a head portion and a neck portion, the neck portion is located between the head portion and the threaded portion, the waterproof module further comprises a retainer, the retainer engages with the neck portion, and the head portion and the retainer are located at opposite sides of the cover, such that the adjusting member is rotatably disposed on the cover.

7. The waterproof module of claim 1, wherein the sliding member is L-shaped or I-shaped.

8. The waterproof module of claim 1, wherein the waterproof module further comprises a first gasket and a second gasket disposed at opposite sides of the ring-shaped sealing member; the adjusting member has a threaded portion, the sliding member has a threaded hole, and the threaded portion is disposed in the threaded hole.

9. A display device comprising:
    a display panel; and
    a waterproof module comprising:

a frame, the display panel being disposed in the frame, the frame having an accommodating recess, the accommodating recess having a guiding rail;

a sliding member disposed in the accommodating recess, the sliding member having a tapered structure and a guiding groove, the guiding rail being disposed in the guiding groove, such that the sliding member is disposed in the accommodating recess, the tapered structure having a first flat surface, a second flat surface, and an inclined surface connecting the first flat surface and the second flat surface;

a ring-shaped sealing member, an end of the tapered structure being sandwiched in between the frame and the ring-shaped sealing member;

a cover disposed on the frame; and an adjusting member connected to the sliding member;

wherein when the adjusting member drives the sliding member to move within the accommodating recess towards a first direction, the tapered structure pushes the ring-shaped sealing member to move towards a second direction, the first direction is different from the second direction.

10. The display device of claim 9, wherein the waterproof module further comprises a first gasket and a second gasket disposed at opposite sides of the ring-shaped sealing member.

11. The display device of claim 9, wherein an opening exists between a first end and a second end of the ring-shaped sealing member, the waterproof module further comprises an elastic member, and the elastic member connects the first end and the second end.

12. The display device of claim 9, wherein the adjusting member has a threaded portion, the sliding member has a threaded hole, and the threaded portion is disposed in the threaded hole, such that the adjusting member is connected to the sliding member.

13. The display device of claim 12, wherein the adjusting member further has a head portion and a neck portion, the neck portion is located between the head portion and the threaded portion, the waterproof module further comprises a retainer, the retainer engages with the neck portion, and the head portion and the retainer are located at opposite sides of the cover, such that the adjusting member is rotatably disposed on the cover.

14. The display device of claim 9, wherein the sliding member is L-shaped or I-shaped.

15. The display device of claim 9, wherein the waterproof module further comprises a first gasket and a second gasket disposed at opposite sides of the ring-shaped sealing member; the adjusting member has a threaded portion, the sliding member has a threaded hole, and the threaded portion is disposed in the threaded hole.

16. The display device of claim 9, further comprising a touch panel disposed on the display panel and fixed on a flange of the frame.

* * * * *